United States Patent [19]

Lindmayer

[11] Patent Number: 4,693,906

[45] Date of Patent: Sep. 15, 1987

[54] DIELECTRIC FOR ELECTROLUMINESCENT DEVICES, AND METHODS FOR MAKING

[75] Inventor: Joseph Lindmayer, Rockville, Md.

[73] Assignee: Quantex Corporation, Rockville, Md.

[21] Appl. No.: 813,928

[22] Filed: Dec. 27, 1985

[51] Int. Cl.$^4$ .............................................. B05D 5/06
[52] U.S. Cl. .................................... 427/69; 427/64; 427/66; 427/126.2; 427/126.3; 427/255.3; 427/343; 427/377
[58] Field of Search ...................... 427/69, 255.3, 343, 427/64, 377, 126.2, 126.3, 66

[56] References Cited

U.S. PATENT DOCUMENTS

| | | | |
|---|---|---|---|
| 3,522,071 | 7/1970 | Yokota et al. | 427/64 |
| 3,927,224 | 12/1975 | Levene | 427/64 |
| 4,201,798 | 8/1980 | Lindmayer | 427/255.3 |
| 4,263,339 | 4/1981 | Fischer | 427/64 |

*Primary Examiner*—Norman Morgenstern
*Assistant Examiner*—Janyce A. Bell
*Attorney, Agent, or Firm*—Peter C. Van Der Sluys

[57] ABSTRACT

Disclosed are electroluminescent devices employing a stabilized tantalum sub-oxide as a dielectric. The tantalum sub-oxide is a non-stoichiometric oxide of the general form $Ta_2O_m$, where $4.5 < m < 5.0$, stabilized by bonds with suitable anions such as OH. In a disclosed method, a layer of tantalum sub-oxide is deposited to a thickness of from 3000 to 4000 angstroms. More particularly, a source mixture of tantalum metal and tantalum pentoxide is provided, vaporized by electron beam evaporation, and allowed to condense on a surface. The layer of tantalum sub-oxide is exposed to anions for completing a stable oxide network. Preferably, the anions are OH radicals, and the bonds are formed by exposing the layer to a humid atmosphere. The thus-stabilized layer is reheated to remove any water.

7 Claims, 1 Drawing Figure

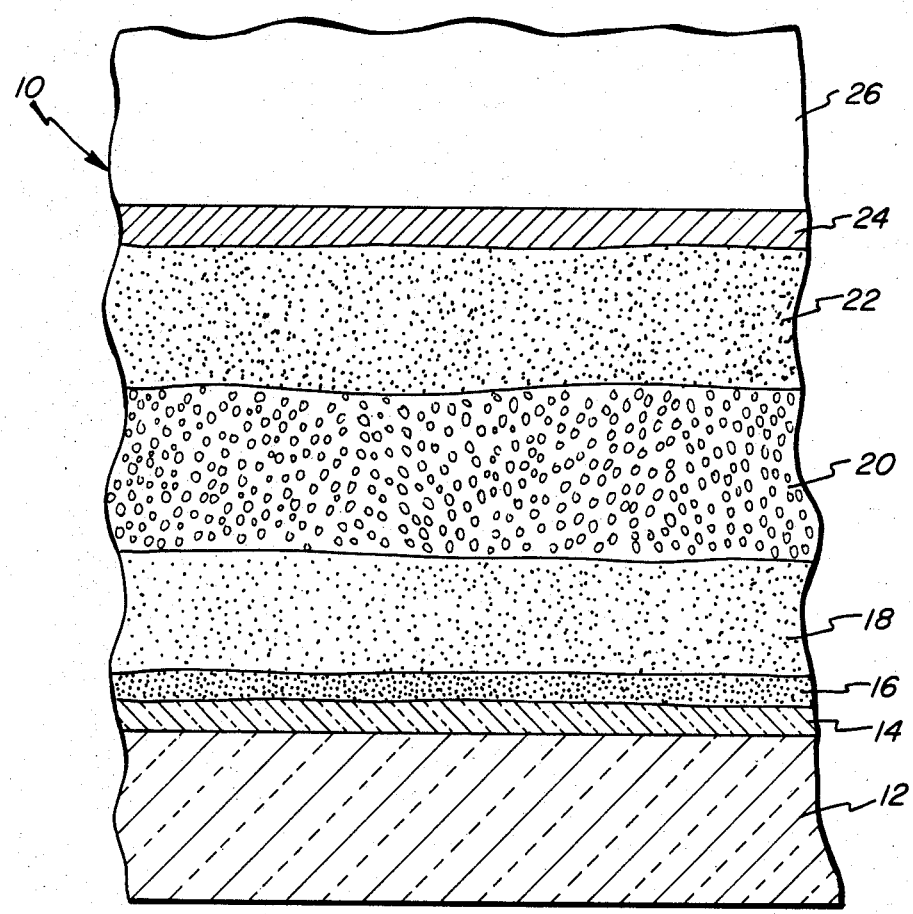

DIELECTRIC FOR ELECTROLUMINESCENT DEVICES, AND METHODS FOR MAKING

BACKGROUND OF THE INVENTION

The present invention relates to dielectric materials for thin film electroluminescent devices. This is a companion to related application Ser. No. 813929, filed Dec. 27, 1985, concurrently herewith, by Joseph Lindmayer, and entitled "Stable Optically Transmissive Conductors, Including Electrodes for Electroluminescent Devices, and Methods for Making", the entire disclosure of which is hereby expressly incorporated by reference. The subject invention and the invention to which related application Ser. No. 813929 is directed are each improvements in the field of electroluminescent devices and, when employed together, result in highly-reliable and bright electroluminescent devices which operate without catastrophic breakdowns.

Electroluminescent devices have a long history, both as lamps and as displays. Earlier development had as its objective the development of a solid state lamp as a light source, typically in the form of a flat panel. More recently, electroluminescence has been employed in flat panel display systems, involving either pre-defined character shapes or individually-addressable pixels in a rectangular matrix.

The basic structure of an electroluminescent device is well known, and comprises an electroluminescent layer sandwiched between a pair of electrodes and separated from the electrodes by respective dielectric layers. Electroluminescence is the emission of light from a polycyrstaline phosphor solely due to the application of an electric field. While various electroluminescent materials are known, one generally accepted is ZnS as a host, with Mn as an activator.

For separating and electrically insulating the electroluminescent layer from the electrodes, a variety of dielectric materials have been proposed and employed. The semiconductor field, the solar cell field, the capacitor field, have all dealt with thin layers of insulators or oxides. Concerning thin layers of oxides there exists a variety of information on their characteristics, including dielectric constants, optical transmission, dielectric strength, development of pinholes, stability, and the like. A large amount of information or laboratory knowledge is available concerning different oxide interactions with supporting substrates or electrodes. However, there is a great deal which is not known. In addition, many of the oxide properties depend on the way they were formed. Some oxides are mixtures, such as SiO or $SiO_x$, which have been used in electroluminescent device experiments. Silicon monoxide for example is known to be a mixture of Si and $SiO_2$. Silicon monoxide is not stable when supporting large electric fields.

The electrodes differ from each other, depending upon whether it is the "rear" or the "front" viewing side of the device. A reflective metal, such as aluminum, is typically employed for the electrode on the "rear" side of the device, and a relatively thin optically transmissive layer of indium tin oxide (ITO) is typically employed for the electrode on the "front" side of the device. In lamp applications, both electrodes take the form of continuous layers, thereby subjecting the entire electroluminescent layer between the electrodes to the electric field. In a typical display application, the "front" and "rear" electrodes are suitably patterned so as to define row and column electrodes. Pixels are thus defined where the row and column electrodes overlap. Various electronic display drivers are well known which address individual pixels by energizing one row electrode and one column electrode at a time.

While seemingly simple in concept, the development of electroluminescent devices has met with many practical difficulties. Very generally, these practical difficulties arise from two factors. First, the devices are thin-film devices where even a small defect in a particular layer can cause a failure. Second, these thin-film devices are operated at relatively high voltages, typically ranging from 100 volts to 400 volts peak-to-peak. In this regard, electroluminescent devices are perhaps unique among solid state electronic devices in that the ZnS electroluminescent layer is operated beyond its dielectric breakdown voltage, and thus conducts, while the thin-film dielectric layers on either side are required to stop the conduction.

Manifestly, even a small defect can lead to catastrophic failure, and this has indeed been a problem with the prolonged application of large electric fields, during operation.

SUMMARY OF THE INVENTION

It is an object of the invention to provide an improved, stable, minimum-breakdown dielectric for use in electroluminescent devices.

It is another object of the invention to provide extremely bright electroluminescent structures.

Briefly, in accordance with the invention it has been discovered that stabilized tantalum sub-oxide is a superior dielectric for bright electroluminescent devices. The tantalum sub-oxide is a non-stoichiometric oxide of the general form $Ta_2O_m$, where $4.5 < m < 5.0$, which is stabilized by bonds with suitable anions such as OH.

The invention provides a method of forming such a dielectric layer which has as an initial step the depositing of a layer of tantalum sub-oxide of the form $Ta_2O_m$, where $4.5 < m < 5.0$, to a thickness of from 1000 to 6000 angstroms. In a preferred process, a source mixture of tantalum metal and tantalum pentoxide is provided, vaporized, such as by electron beam evaporation, and the vapors are then allowed to condense on a surface which is to receive the dielectric layer. The surface which receives the dielectric layer can be either one of the device electrodes, or the electroluminescent layer.

Next, the layer of tantalum sub-oxide is exposed to anions for completing a stable oxide network of the form $Ta_2O_mX_{5-m}$. Preferably, the anions are OH radicals, and the bonds are formed by exposing the layer of tantalum sub-oxide to an atmosphere including $H_2O$ vapor, for example humid air, such that OH bonds are formed to complete a stable oxide network of the form $Ta_2O_m \cdot (OH)_{5-m}$.

Any moisture remaining in an electroluminescent device structure is highly deleterious, and rapidly leads to device breakdown. Acorrdingly, after exposure to the humid atomosphere, the layer of now-stabilized tantalum sub-oxide is reheated, for example to 500° C., to remove any $H_2O$ from the oxide.

BRIEF DESCRIPTION OF THE DRAWING

While the novel features of the invention are set forth with particularity in the appended claims, the invention, both as organization and content, with the better understood and appreciated, along with other objects and features thereof, from the following detailed description taken in conjunction with the drawing, in which:

The single drawing FIGURE is a representative cross section of a thin film electroluminescent device, typical of either a lamp or a single pixel in a display.

DETAILED DESCRIPTION

Referring now to the single drawing FIGURE, depicted in cross section is a typical electroluminescent device 10. The figure may be viewed either as the cross section of an electroluminescent lamp having continuous electrodes, or as the cross section of a single pixel in a electroluminescent display having defined row and column electrodes which overlap to define pixel locations.

The device 10 is formed on a suitable transparent substrate 12 such as a glass known as Corning 7059. Light from the device 10 is transmitted through the glass substrate 12.

Deposited directly on the substrate 12 is a "front" electrode 14 comprising indium tin oxide (ITO). In the case of an electroluminescent display, the "front" electrode 14 may arbitrarily be designated the "column" electrode.

In order to achieve a relatively high resistivity, for example in the preferred range of from above 1000 ohms per square, the ITO layer 14 is less than 100 angstroms in thickness.

In accordance with the invention to which the above-identified companion application Ser. No. 813,929 is directed, this ultra-thin ITO layer 14 is stabilized or "passivated" by a layer 16 of refractory metal oxide. The oxide layer is formed from a layer of refractory metal having a thickness, before oxidation, of less than 100 angstroms and, preferably, within the range of 30 to 50 angstroms. Preferably, the layer 16 comprises palladium oxide, but other refractory metal oxides may be employed as well, such as nickel oxide.

The resulting double layer of ITO 14 and refractory metal oxide 16 is highly stable, and does not change or burn out while carrying the currents associated with bright electroluminescent device operation.

The next device layer is a dielectric layer 18, with which the present invention is particularly concerned. In accordance with the invention, a particular dielectric material, has been identified which stands out by far for stability, minimum breakdown, and other desirous characteristics in electroluminescent devices, resulting in extremely bright electroluminescent structures. That dielectric is a tantalum sub-oxide, of the form $Ta_2O_mX_{5-m}$, where $4.5 < m < 5.0$, and X is a suitable anion, such as an OH radical, for stabilizing the oxide structure. The non-stoichiometric $Ta_2O_m$ sub-oxide itself is not especially stable. However, by forming bonds with an anion, for example OH upon exposure to a humid atmosphere, a highly-stable oxide network is formed. It may be noted that a similar phenomenon occurs with glasses.

In addition to its highly advantageous dielectric characteristics, the other device layers adhere well to the tantalum sub-oxide.

In a preferred method, a non-stoichiometric source mixture of tantalum metal and tantalum pentoxide is provided, vaporized, and the vapors are allowed to condense on the surface which is to receive the dielectric layer, for example the surface of the electrode layer comprising the ITO 14 the refractory metal oxide 16. This deposition is carried out to a thickness of from 3000 to 4000 angstroms.

While electron beam evaporation techniques are well known to those of skill in the art, in brief summary, a mixture of tantalum pentoxide and elemental tantalum, in a ratio of 4:1, pentoxide to metal, is placed in a crucible in a vacuum chamber in which the stabilized ITO-coated substrate is placed. A vacuum of $3 \times 10^{-5}$ Torr or below is drawn in the chamber. The electron gun is then activated so that an electron beam is focused on a spot in the mixture of $Ta_2O_5$ and Ta in the crucible. The electron beam may be deflected by means of a magnetic field and swept in a pattern to scan an area within the crucible, thereby efficiently melting the mix. When the melt has formed and evaporation begins to take place, exposed surfaces are exposed to vapors, which then condense.

The same tantalum pentoxide source mixture can subsequently be reused in the electron gun evaporator, as repeated use inherently results in a source which becomes non-stoichiometric, i.e. more and more metallic.

The device including the dielectric layer 20 is then cooled, and exposed to water vapor, such as humid air, thereby forming OH bonds to stabilize the oxide network, as discussed above.

Inasmuch as the presence of water in a completed electroluminescent device structure is highly damaging, the device including the dielectric layer 20 is reheated to 500° C. to drive off any excess $H_2O$.

The next layer is an electroluminescent layer 20, which also may be termed a phosphor. The electroluminescent layer 20 is typically 500 nanometers in thickness, and preferably is ZnS as a host with Mn as an activator, as is well known in the art.

The next layer 22 is another dielectric layer, which is substantially the same as the dielectric layer 18, described in detail above.

A "rear" electrode 24 is provided, which may comprise an aluminum layer 20 to 50 nanometers in thickness. Normally, the aluminum "rear" electrode 24 is reflective, thereby nearly doubling the light output from the device as viewed through the glass substrate 12.

Finally, a suitable seal material 26 encapsulates the entire structure, inasmuch as any moisture allowed to enter the structure would result in rapid failure.

It will be appreciated that appropriate edge connection leads (not shown) are required to enable an AC electric field to be applied to the electrodes 14 and 24.

While specific embodiments of the invention have been illustrated and described herein, it is realized that numerous modifications and changes will occur to those skilled in the art. It is therefore to be understood that the appended claims are intended to cover all such modifications and changes fall within the true spirit and scope of the invention.

What is claimed is:

1. A method of forming a dielectric layer in a electroluminescent device of the type including an electroluminescent layer sandwiched between a pair of electrodes and separated from the electrodes by respective dielectric layers, said method comprising: vapor depositing a layer of tantalum sub-oxide of the form $Ta_2O_m$, where $4.5 < m < 5.0$; and exposing the layer of tantalum sub-oxide to OH radicals for completing a stable oxide network of the form $Ta_2O_mOH_{5-m}$.

2. A method in accordance with claim 1, wherein the layer of tantalum sub-oxide is deposited to a thickness in the range of from 1000 to 6000 angstroms.

3. A method of forming a dielectric layer in an electroluminescent device of the type including an electroluminescent layer sandwiched between a pair of electrodes and separated from the electrodes by respective dielectric layers, said method comprising: vapor depositing a layer of tantalum sub-oxide of the form $Ta_2O_m$, where $4.5 < m < 5.0$;

exposing the layer of tantalum sub-oxide to an atmosphere including $H_2O$ vapor such that OH bonds are formed to complete a stable oxide network of the form $Ta_2O_m \cdot (OH)_{5-m}$; and reheating the layer of tantalum sub-oxide to remove any $H_2O$ from the oxide.

4. A method in accordance with claim 3, wherein the layer of tantalum sub-oxide is deposited to a thickness in the range of from 1000 to 6000 angstroms.

5. A method of forming a dielectric layer in an electroluminescent device of the type including an electroluminescent layer sandwiched between a pair of electrodes and separated from the electrodes by respective dielectric layers, said method comprising:

providing a source mixture of tantalum metal and tantalum pentoxide;

vaporizing the source mixture;

allowing the vapors to condense on a surface which is to receive the dielectric layer, thereby forming thereon a layer of tantalum sub-oxide of the form $Ta_2O_m$, where $4.5 < m < 5.0$;

exposing the layer of tantalum sub-oxide to an atmosphere including $H_2O$ vapor such that OH bonds are formed to complete a stable oxide network of the form $Ta_2O_m \cdot (OH)_{5-m}$; and reheating the layer of tantalum sub-oxide to remove any $H_2O$ from the oxide.

6. A method in accordance with claim 5, wherein the surface is a surface of one of the electrodes.

7. A method in accordance with claim 5, wherein the surface is a surface of the electroluminescent layer.

* * * * *

UNITED STATES PATENT AND TRADEMARK OFFICE
CERTIFICATE OF CORRECTION

PATENT NO. : 4,693,906
DATED : September 15, 1987
INVENTOR(S) : Joseph Lindmayer It is certified that error appears in the above-identified patent and that said Letters Patent are hereby corrected as shown below:

Column 1, prior to line 6, insert --This invention was made with Government Support under Contract No. F33657-85-C-2233 awarded by SBIR. The Government has certain rights in this invention.--

Signed and Sealed this

Sixteenth Day of August, 1988

*Attest:*

DONALD J. QUIGG

*Attesting Officer*           *Commissioner of Patents and Trademarks*